United States Patent
Gatherer et al.

(10) Patent No.: US 6,480,534 B1
(45) Date of Patent: Nov. 12, 2002

(54) APPARATUS AND METHOD FOR A REDUCED COMPONENT EQUALIZER CIRCUIT

(75) Inventors: Alan Gatherer, Richardson, TX (US); Hiep Van Tran, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/165,450

(22) Filed: Oct. 2, 1998

(51) Int. Cl.$^7$ ................................................ H03H 7/30
(52) U.S. Cl. ........................ 375/229; 375/350; 708/300; 708/323
(58) Field of Search ................................ 375/229, 350; 333/18, 28 R; 708/323, 300, 301

(56) References Cited

U.S. PATENT DOCUMENTS

| | | | |
|---|---|---|---|
| 3,928,755 A | * 12/1975 | Bellanger et al. | 364/724.19 |
| 4,356,559 A | * 10/1982 | Candy et al. | 364/724 |
| 4,821,223 A | * 4/1989 | David | 364/724.05 |
| 5,396,299 A | * 3/1995 | Greenberg | 348/614 |
| 5,450,339 A | * 9/1995 | Chester et al. | 364/724.19 |
| 5,487,023 A | * 1/1996 | Seckora | 364/724.13 |
| 5,502,747 A |   3/1996 | McGrath | |
| 5,805,480 A | * 9/1998 | Greenberg | 375/232 |
| 5,841,810 A | * 11/1998 | Wong et al. | 375/232 |
| 5,995,542 A | * 11/1999 | Goeckler | 375/229 |

FOREIGN PATENT DOCUMENTS

| | | |
|---|---|---|
| EP | 0 300 449 | 7/1988 |
| EP | 0 458 695 A | 5/1991 |
| EP | 0 748 124 A | 12/1996 |

* cited by examiner

*Primary Examiner*—Temesghen Ghebretinsae
(74) *Attorney, Agent, or Firm*—J. Dennis Moore; W. James Brady, III; Frederick J. Telecky, Jr.

(57) ABSTRACT

In an equalizer filter unit, the filter is divided into a plurality of sequential segments. While all the components of the equalizer unit multiply data signal groups by the a coefficient signal group, in only one segment are the coefficient signal groups updated. The data and the coefficient signal groups are periodically transferred to the next sequential filter segment while the filter segments are reconfigured in the original sequential order. In this manner, the each data signal group interacts with a coefficient signal group in the original sequential order. Because the coefficients are updated in only one of the filter segments, the amount of apparatus required for processing signal groups is reduced.

12 Claims, 9 Drawing Sheets

FIG. 5B

APPARATUS AND METHOD FOR A REDUCED COMPONENT EQUALIZER CIRCUIT

BACKGROUND OF THE INVENTION

1. Field of the Invention

This invention relates generally to the processing of data signals in communication systems and, more particularly, the processing of data signals in equalizer filter circuits. Equalizer filter circuits or adaptive filter circuits are used to compensate for distortion introduced into the channel during the transmission of the data signals. The present invention has particular applicability to modem units.

2. Description of the Prior Art

Figure 1:
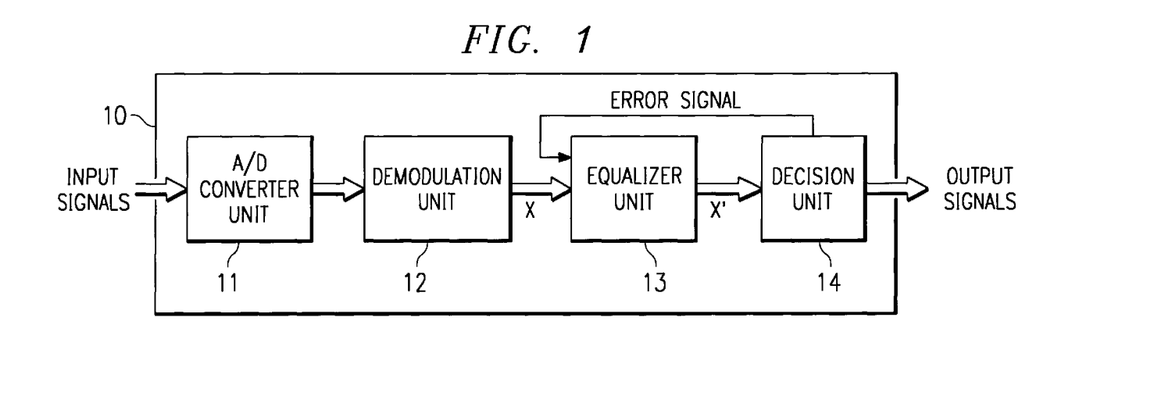
FIG. 1 is a block diagram of a modem unit according to the prior art.

Referring to FIG. 1, a block diagram of a modem unit 10, according to the prior art, is shown. INPUT data signals, typically transmitted over a cable, are applied to A/D converter unit 11 of the modem unit 10. The output signal of A/D converter unit 11 is applied to demodulation unit 12. The demodulation unit 12 can generate a real signal portion R and an imaginary signal portion I. The signals R and I are applied to equalizer unit 13. The modified real and imaginary signals R' and I', resulting from processing within the equalizer unit, are applied to decision unit 14. The decision unit 14 provides the OUTPUT signals of modem unit 10 and generates an complex ERROR signal e which is applied to equalizer unit 13.

Figure 2A:
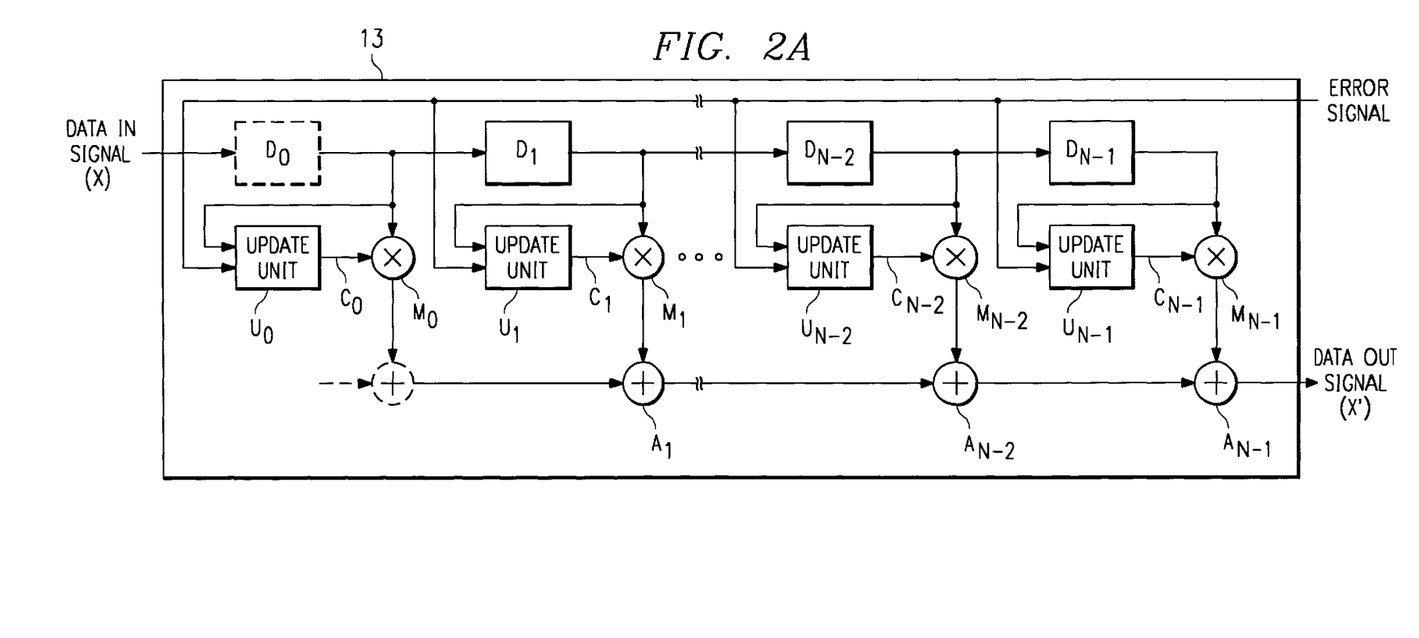
FIG. 2A is a block diagram of an implementation of a direct form equalizer filter unit according to the prior art.

Referring to FIG. 2A, a block diagram of an equalizer unit 13, such as would be used in the modem unit 10 of FIG. 1 for processing a complex INPUT data signals X, is shown. The equalizer unit 13 includes a multiplicity N of stages. Each stage n of the equalizer unit 13 includes a delay line $D_n$. The delay lines $D_0$–$D_{N-1}$ of all of the stages are coupled in series. The output terminal of each delay line $D_n$ is coupled, in addition to the next sequential delay line $D_{n+1}$, to a multiplier unit $M_n$ and to an input terminal of update unit $U_n$. Each multiplier unit $M_n$ also receives a coefficient signal $C_n$. The coefficient signal is a signal group stored in the update unit $U_n$ which is updated in update unit $U_n$ in response to an ERROR signal. An ERROR signal e is generated as a result the processing of each signal group in the decision unit 14 (as shown in FIG. 1). The product of the signals $C_n$ and the output signal from delay line $D_n$ formed in multiplier unit $M_n$ is applied to adder unit $A_n$. The adder unit $A_n$ receives an output signal from the previous sequential adder unit $A_{n-1}$ and the summation of the output signal for multiplier unit $M_n$ and the output signal from adder unit $A_{n-1}$ is applied to the next sequential adder unit $A_{n+1}$. For a series of N delay lines, the input signal X is applied to delay line $D_0$ and the output signal X' is applied to the output terminal of adder unit $A_{N-1}$. The delay line $D_0$, shown with dotted lines, is not necessary for the operation of the typical filter, but this element is present in the implementation of the present invention.

Figure 2B:
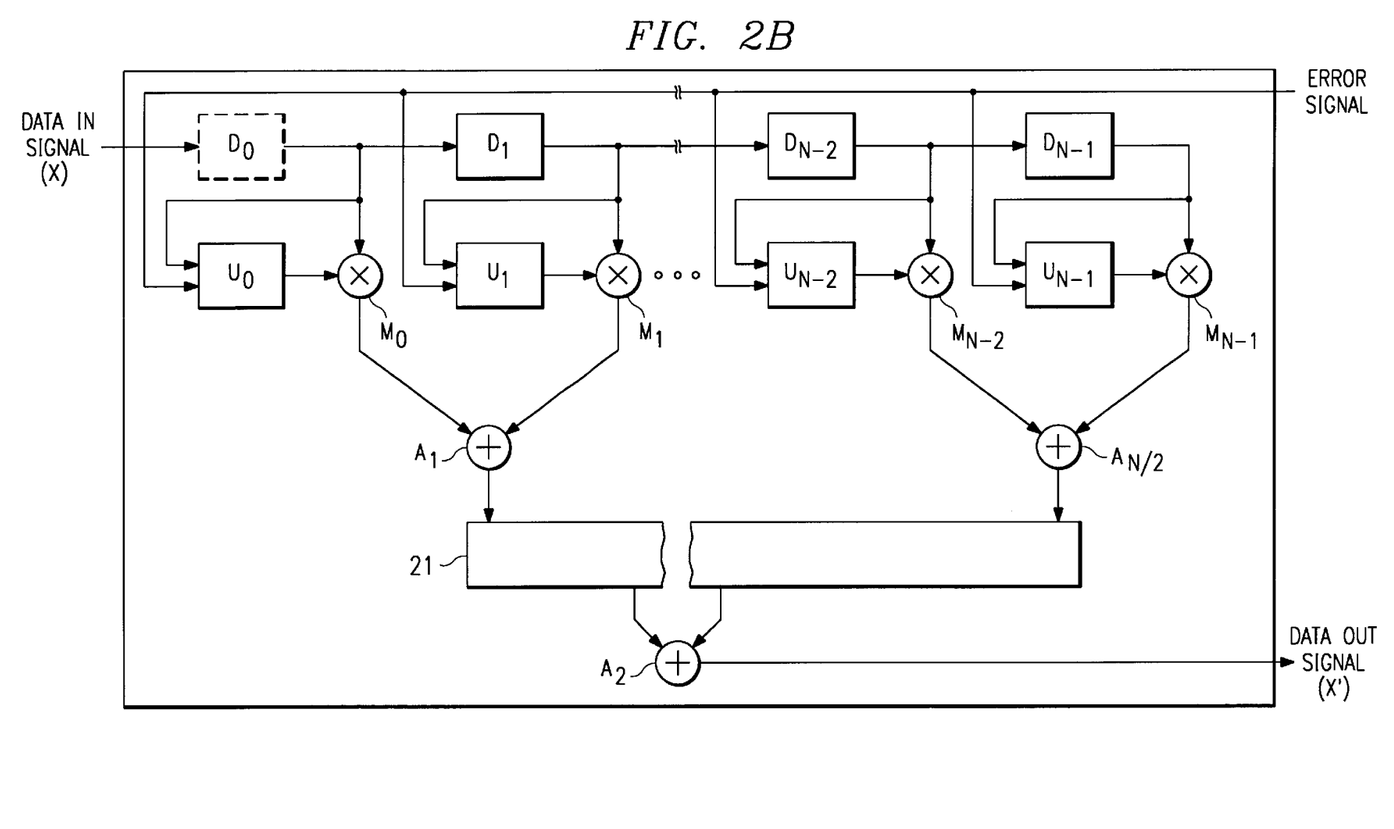
FIG. 2B is a block diagram of a second implementation of a direct form equalizer unit.

The equalizer unit 13 shown in FIG. 2A is generally referred to as a direct form of an equalizer filter unit or adaptive filter unit. In FIG. 2B, the direct form of an equalizer unit is shown in which the series of adder units $A_1$ through $A_{N-1}$ of FIG. 2A is replaced by an inverted adder tree in order to reduce latency required to perform the addition operation. Adder units $A_0$ through $A_{N/2}$ each receive signals from two multiplier units and apply output signals therefrom to adder tree circuit 21. Two output signals from the adder tree circuit 21 are applied to an adder unit AZ, which in turn has the OUTPUT signal X' applied to an output terminal thereof. As in FIG. 1, the delay line $D_0$, shown with dotted lines, is not necessary in the implementation of the equalizer filter unit as illustrated. However, this element is used in the present invention.

Figure 2C:
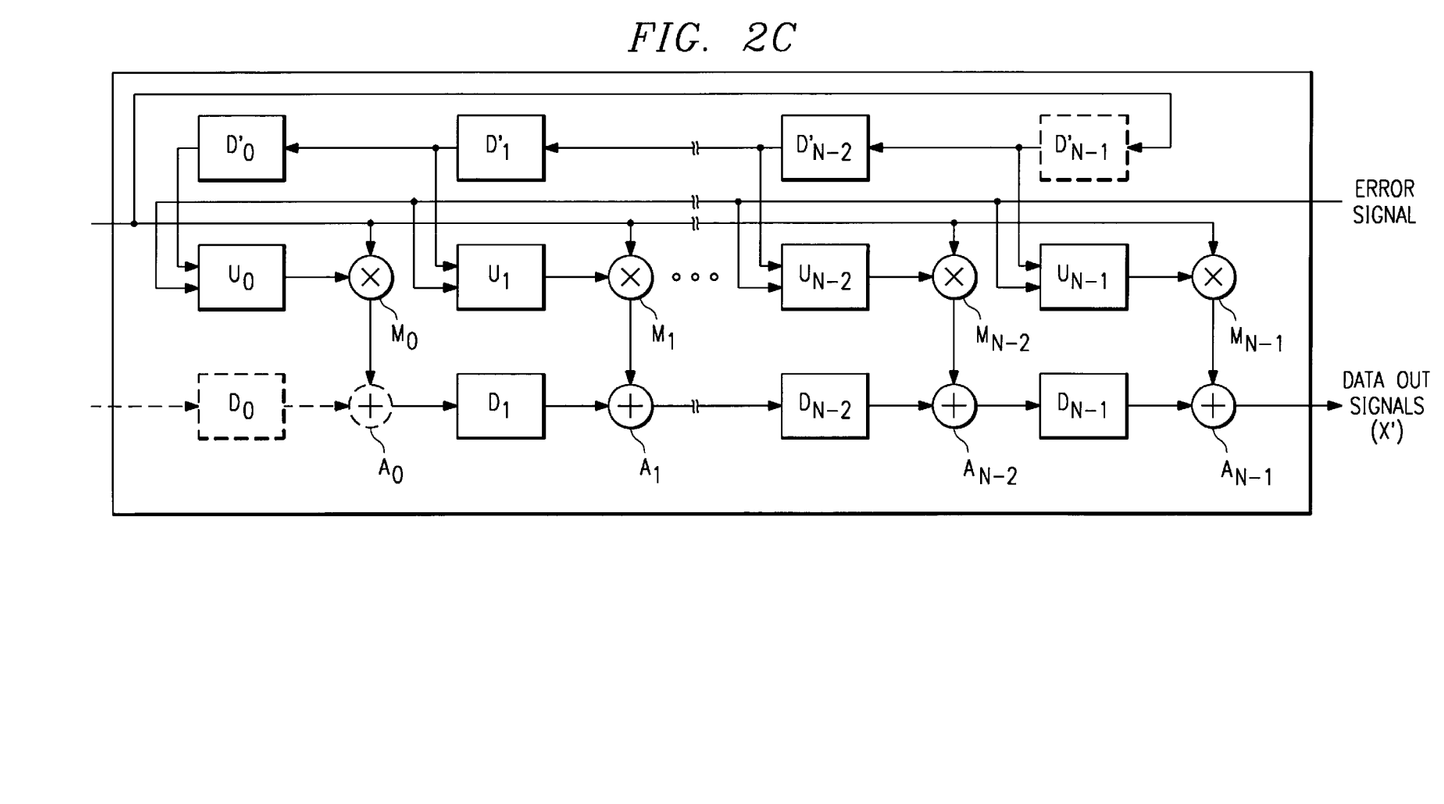
FIG. 2C is a block diagram of a transpose form equalizer unit.

In FIG. 2C, a transpose form of an equalizer unit is shown in which each stage has a configuration differing from the direct form. Each stage of the transpose form of the equalizer unit includes two delay lines, an update unit, a multiplier unit, and an adder unit. In this configuration, DATA IN signals are applied to each multiplier unit $M_n$ associated with equalizer unit stage n and to the first delay line $D_0$ in a series of a adder unit $A_n$/delay lines $D_n$. The multiplier unit $M_n$ also has a coefficient value stored in update unit $U_n$ applied thereto. The input signal is also applied to series of delay lines $D'_n$, each delay line being associated with one stage of the $n^{th}$ stage equalizer filter unit. The INPUT signal groups are transmitted through the series of delay lines $D'_n$, however, the signal groups are transferred in the reverse sequential order from the flow of processed signal groups through the equalizer stages. The update unit $U_n$ receives output signals from a delay line $D'_n$ associated with stage n. The output signals from multiplier unit $M_n$ are applied to an $n^{th}$ stage adder unit $A_n$. The adder unit $A_n$ has an output signal from delay $D_n$ applied thereto and the output signal from adder $A_n$ is applied to the input terminal of the $(n+1)^{th}$ stage delay line $D_{n+1}$. The output signal from delay line $D_{n+1}$ is applied to the input terminal of the $A_{n+1}$ adder unit associated with the $(n+1)^{th}$ equalizer filter unit stage. An ERROR signal e is also applied to update unit $U_n$. The output signal from adder $A_{N-1}$ is the output signal of the equalizer filter unit. The delay line $D_0$, the delay line $D'_{n-1}$ and the adder unit $A_0$, shown by dotted lines, are not necessary for the normal implementation of an equalizer filter, but are needed in the implementation of the present invention.

The input data signal X has a real part R and an imaginary part I. For each input data signal group, $X_i = R_i + jI_i$. When k is equal to the number of the latest data signal group to be entered in the equalizer (also referred to as an iteration), then as will be clear to those familiar with equalizer units:

$$X'_k = R' + jI' = \Sigma(i=0 \rightarrow N-1) C^*_{i,k} X_{k-1}.$$

and $$C_{i,k+1} = C_{i,k} + \mu e^*_k X_{k-1}$$

where all the quantities except $\mu$ can be complex, * denotes the complex conjugate of the number and $e_k$ is the error signal generated by the decision unit after $X'_k$ has been generated by the equalizer unit. As this equation indicates, the multiplier coefficients are updated. This requirement for updating these coefficients provides further complexity in the implementation of the equalizer unit.

In a typical equalizer unit, the number of delay lines N can be large. Because each delay line $D_n$ is coupled to a multiplier unit $M_n$ and an adder unit $A_n$, the equalizer unit 13 can occupy approximately one half of the area of the silicon chip on which the modem unit 10 has been fabricated.

A need has therefore been felt for apparatus and an associated method to reduce the number of components required to implement a modem unit, and particularly, the equalizer unit portion of the modem unit, in an integrated circuit.

SUMMARY OF THE INVENTION

The aforementioned and other features are accomplished, according to the present invention, by providing an equalizer unit or adaptive filter unit in which the unit, having N components, is divided into M segments. Of the M segments, only one segment has apparatus for up-dating the coefficients of each equalizer component within the segment. The equalizer unit further includes apparatus for cyclically transferring the data and the coefficient signal groups from one segment to the next consecutive segment. In addition, reconfiguration apparatus couples the segments in such a manner that the data continues to be transferred through the segments of the equalizer unit in the sequence established during an initialization of equalizer unit operation. The equalizer unit therefore reduces the apparatus used in the updating of the coefficients by a factor of approximately 1/M. However, by periodically cycling the coefficients through the equalizer unit, all the coefficients of the equalizer unit will be updated, but the coefficients will be updated approximately 1/N times as often as in the equalizer unit with a coefficient update unit for every component.

These and other features of the present invention will be understood upon the reading of the following description in conjunction with the Figures.

DESCRIPTION OF THE PREFERRED EMBODIMENT(S)

1. Detailed Description of the Drawings

FIGS. 1, 2A, 2B, and 2C have been discussed with respect to the prior art.

Figure 3A:
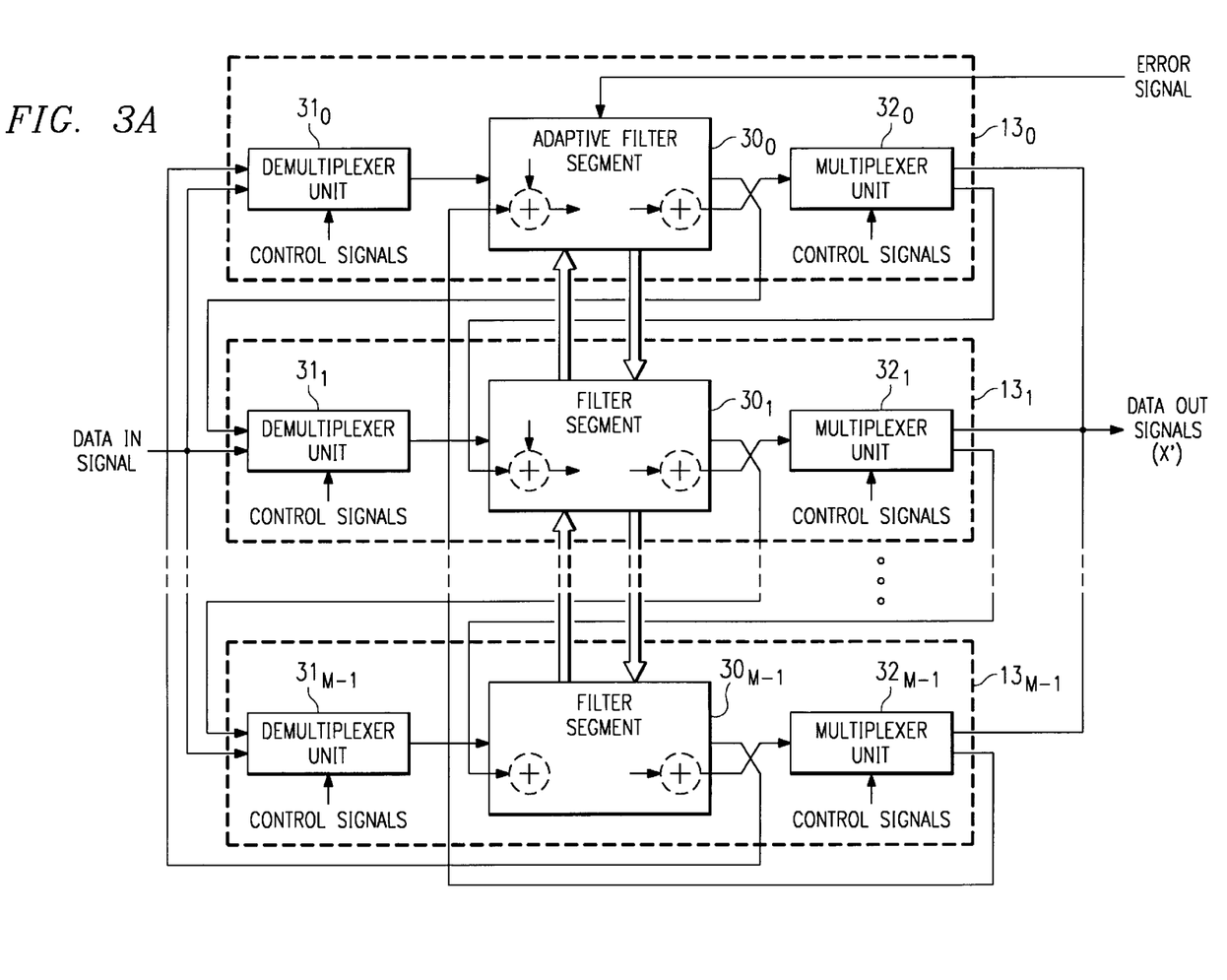
FIG. 3A is a schematic block diagram illustrating a first embodiment of a direct form equalizer filter unit according to the present invention.

Referring now to FIG. 3A, a block diagram of an equalizer filter unit 13, according to the present invention, is shown. The filter unit 13 is divided into M segments, $13_0$ through $13_{M-1}$. Each filter segment $13_x$ receives DATA IN signals or delayed DATA IN signals from an input demultiplexer unit (or switch) $31_x$ and each filter segment $13_x$ applies processed signals (i.e., signals from an adder chain) to output multiplexer unit (or switch) $32_x$. Each input demultiplexer unit $31_x$ has a first input terminal coupled to a DATA IN signal terminal and has a second input terminal coupled to a delayed DATA IN signal output terminal of filter segment $32_{x-1}$. (The delayed signal output terminal of filter segment $30_{M-1}$ is coupled to a second input terminal of input demultiplexer unit $31_0$.) A first output terminal of multiplexer unit $32_x$ applies processed signals to an input terminal of a processed signal input terminal of a filter segment in a next sequential filter segment $30_{x+1}$. A second output terminal of output multiplexer unit $32_x$ is coupled to a DATA OUT terminal. Each equalizer filter segment $13_x$ has apparatus for transferring data and coefficient signal groups currently stored in each equalizer filter section component to corresponding equalizer filter segment components in equalizer filter section $13_{x+1}$. The transfer apparatus can transfer data and coefficient signal groups in equalizer filter segment $13_{M-1}$ to equalizer filter section $13_0$. A error signal is applied only to equalizer (adaptive) filter segment $13_0$.

Figure 3B:
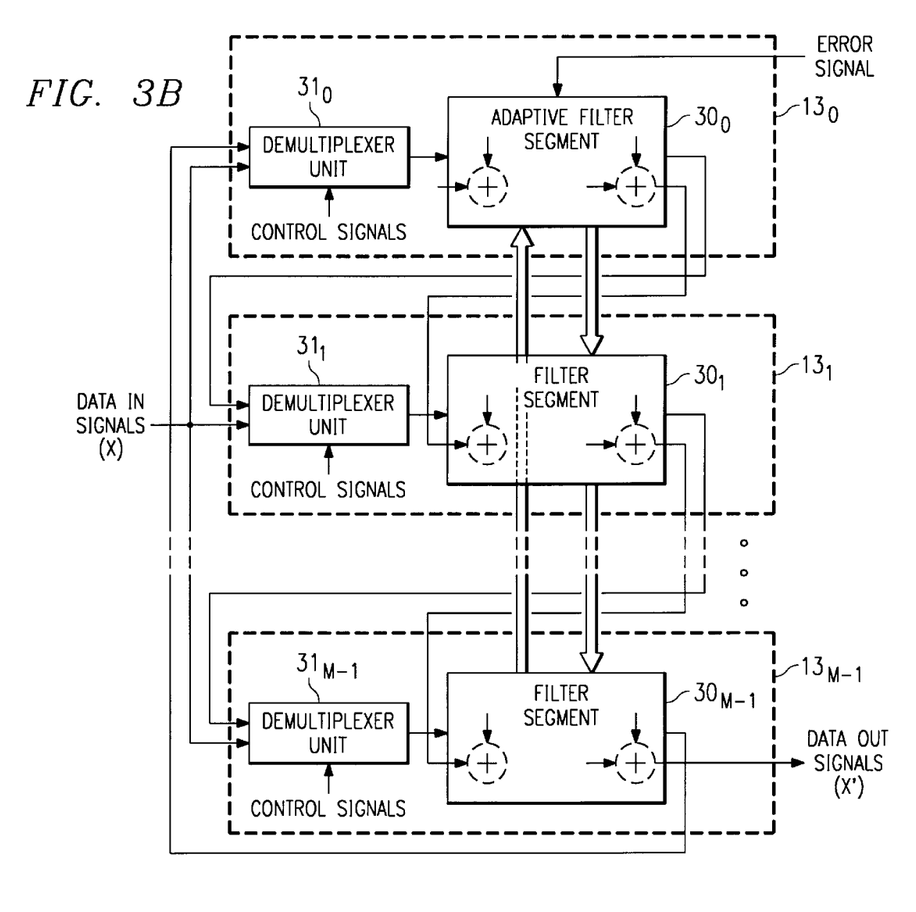
FIG. 3B is a schematic block diagram illustrating a second embodiment of a direct form of an equalizer filter unit according to the present invention.

Referring to FIG. 3B, an alternative implementation of the direct form equalizer filter unit takes advantage of the fact that the series of adder units need not be ordered. Therefore, the multiplexer unit $32_x$ can be eliminated and the adder units coupled in series to provide DATA OUT signals (X').

Figure 3C:
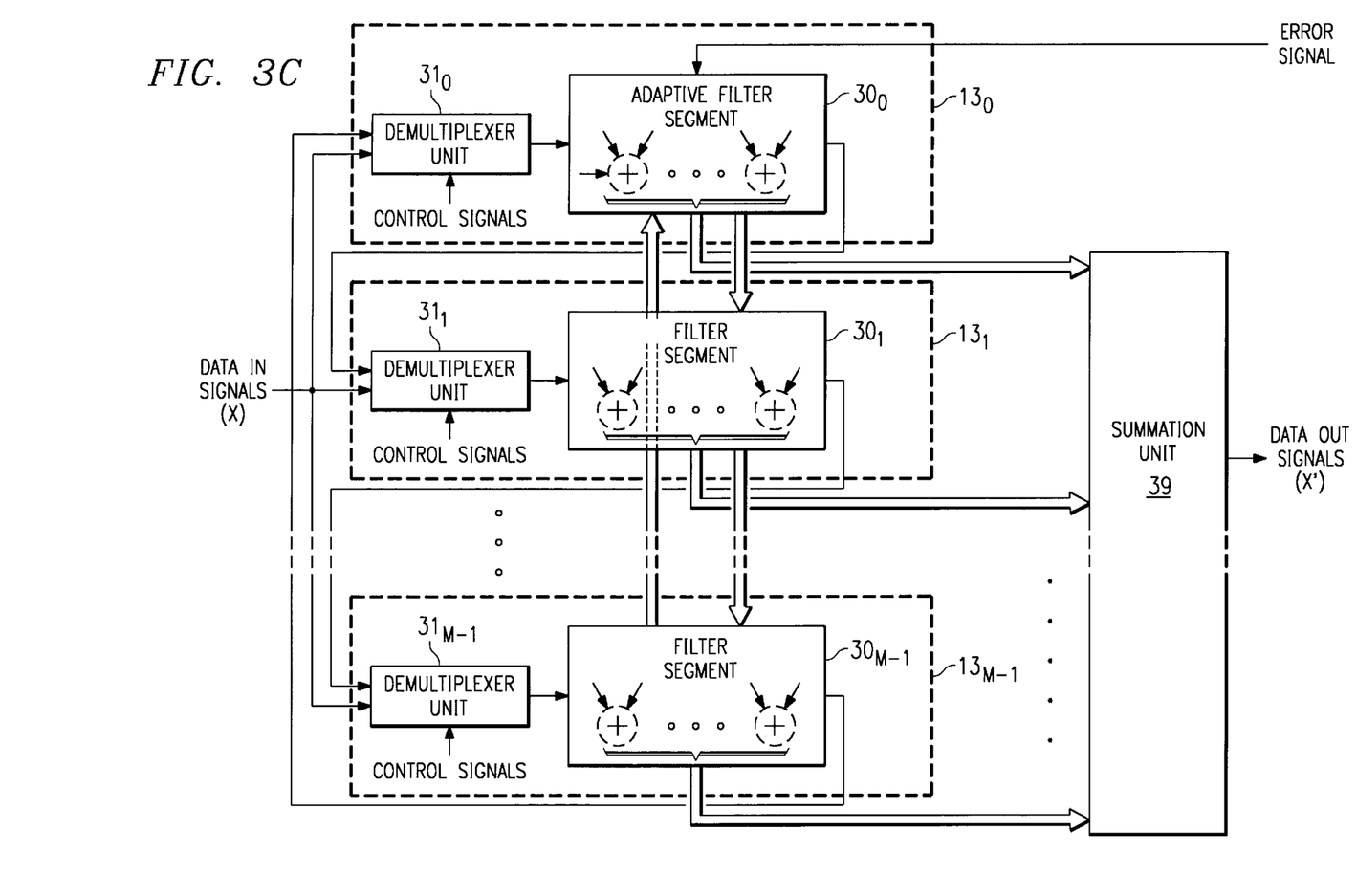
FIG. 3C is a schematic block diagram of a direct form of an equalizer filter unit implemented with an adder tree.

Referring to FIG. 3C, the implementation of a direct form of an equalizer filter unit implemented by an adder tree rather than a series of adder units (cf. FIG. 2A and FIG. 2B.) according to the present invention is shown. In this implementation, the multiplexer units $32_x$ are not required, however, the adder signals from each of the adder units of each of the filter segments are applied to summation unit 39. The output signals of the summation unit 39 are the DATA OUT signals.

Figure 3D:
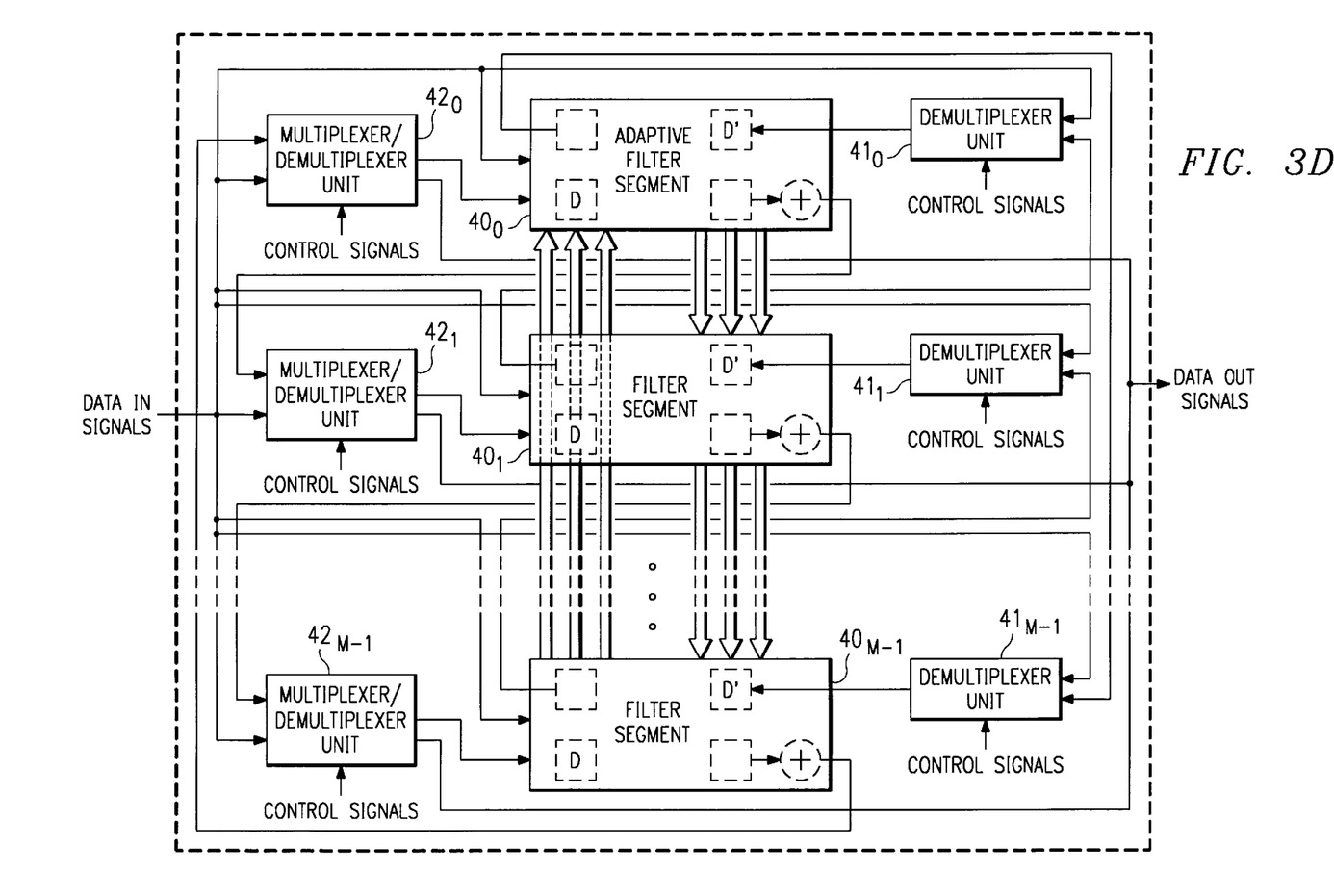
FIG. 3D is a schematic block diagram illustrating a transpose equalizer filter unit according to the present invention.

Referring to FIG. 3D, an schematic block diagram for a transpose form of an equalizer unit according to the present invention is shown. As shown in FIG. 2C, in the transpose form of an equalizer filter, the DATA IN signals are applied to each filter segment $40_m$ to be then applied to all of the multiplier units $M_p$ in the filter segment $40_m$ simultaneously. The DATA IN signals are also applied to a first input terminal of the multiplexer/demultiplexer unit $42_m$ associated with equalizer filter unit segment $40_m$. A first output terminal of the multiplexer/demultiplexer unit $42_m$ is coupled to the first of the series of delay lines $D_p$/adder units $A_p$ included in the associated filter segment $40_m$. The second output terminal of multiplexer/demultiplexer unit $42_m$ is coupled to the DATA OUT terminal. The second input terminal of each multiplexer/demultiplexer unit $42_m$ is coupled to the last adder unit in the series of delay line $D_p$/adder unit $A_p$ combinations in the previous filter segment $40_{m-1}$. The DATA IN signals are coupled to a first input terminal of demultiplexer units $40_0$–$40_{M-1}$. A second input terminal of each demultiplexer $41_m$ receives signals from the last delay line $D'_0$ in the series of delay lines $D'_p$ in the filter segment $40_{m-1}$, i.e., the delay line D' associated with, the first ($0^{th}$) cell of the filter segment $40_m$. The output terminal of demultiplexer unit $41_m$ is coupled to a the first delay line $D'_{P-1}$ of the series of delay lines $D'_p$ in the associated filter segment $40_m$, i.e., the delay line $D'_{P-1}$ being associated with the last cell in the filter segment $40_m$. (The sequence of the elements wraps around from the final filter segment and associated apparatus to the beginning filter segment and associated apparatus, i.e., $(0-1)^{th}$ element is $(M-1)^{th}$ element and $(M+1)^{th}$ element is the $0^{th}$ element.) The ERROR signal is applied only to the update units in the first (adaptive) filter segment $40_0$. The order of the data signals in the data delay lines $D'_p$ in each filter segment and the order of the processed portions of the data in delay lines $D_n$ are both important in the equalizer filter unit. Therefore, transfer apparatus is provided for transferring data signals from the input data delay line $D'_p$ in the $m^{th}$ filter segment to the corresponding input data delay line $D'_p$ in the next sequential $(m+1)^{th}$ filter segment, for transferring data signals from the processed data delay line $D_p$ of the $m^{th}$ filter segment to the corresponding processed data signal delay line $D_p$ in the next sequential $(m+1)^{th}$ filter segment, and for transferring data from each update unit $U_p$ in the $m^{th}$ filter segment to the corresponding update apparatus $U_p$ in the next sequential $(m+1)^{th}$ filter segment (wherein signal groups in the last filter segment $30_{M-1}$ are transferred to corresponding components in the first filter segment $30_0$).

Figure 4A:
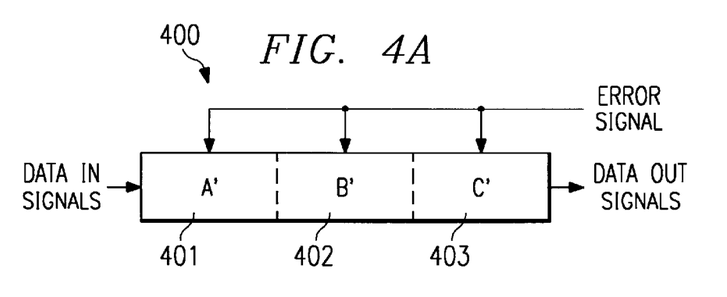
FIG. 4A through FIG. 4F illustrate the transfer of signal groups and the reconfiguration of the equalizer unit of FIG. 3A according to the present invention.
Figure 4B:
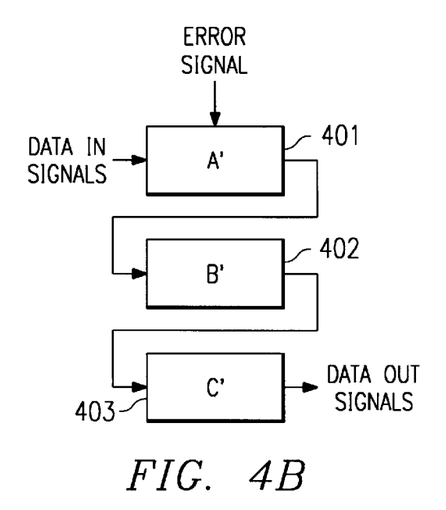
Figure 4C:
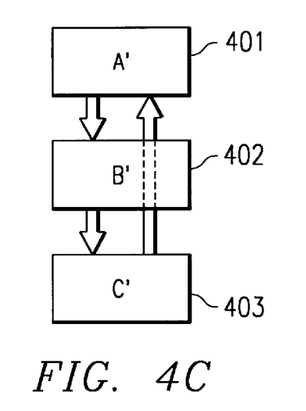
Figure 4D:
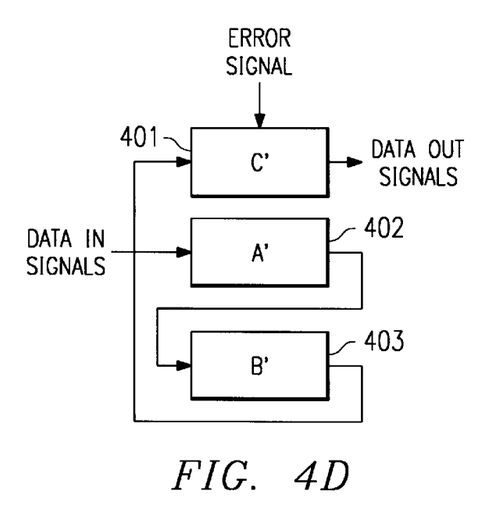
Figure 4E:
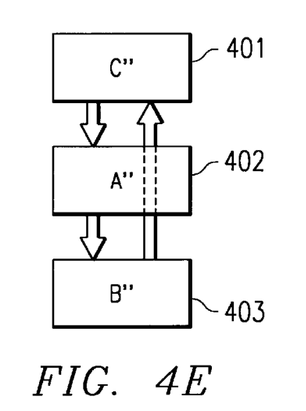
Figure 4F:
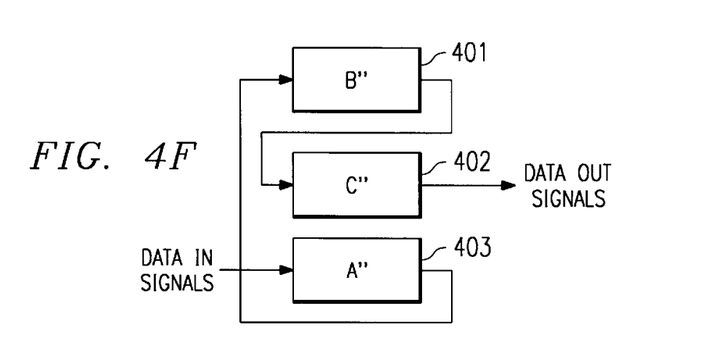

Referring to FIG. 4A through FIG. 4F, the operation of the equalizer filter circuit of the present invention is shown. In these Figs., M=3, the number of segments for the equalizer filter. In FIG. 4A, a typical equalizer filter 400 of the prior art stores data signal groups A', B', and C'. The ERROR signal is applied to all the N filter components. The filter 40 has coefficients $C_0$ though $C_{(N-1)}$) stored therein. The DATA INPUT signals are applied to segment 401 and the DATA OUTPUT signals are applied to an output terminal of segment 403. In FIG. 4B illustrating the present invention, the equalizer filter 40 is divided into segment 401 storing data groups A' and coefficient $C_0$ through $C_{N/3-1}$, into segment 402 storing data groups B' and coefficients $C_{N/3}$ through $C_{2N/3-1}$, and into segment 403 storing data groups in C' and coefficients $C_{2N/3}$ through $C_{N-1}$. Again, the DATA INPUT signal groups are applied to segment 401 and the DATA OUTPUT signal groups are applied to an output terminal of equalizer unit segment 403. However, the ERROR signal is applied only to N/3 components of equalizer unit segment 401. In FIG. 4C, the processing of the DATA INPUT signal groups is halted and the data and the coefficient signal groups stored in equalizer unit segment 401 are transferred to equalizer unit segment 402, the data and the coefficient signal groups of equalizer unit segment 402 are transferred to equalizer unit segment 403 and the data and the coefficient signal groups stored in equalizer unit segment 403 are transferred to equalizer unit segment 401. In FIG. 4D, after the transfer of the data and the coefficient signal groups, equalizer unit segment 401 contains the data signal groups C' and coefficient signals $C_{2N/3}$ through $C_{N-1}$, the equalizer unit segment 402 contains the data signal groups A' and the coefficient signal groups $C_0$ through $C_{N/3-1}$, and the equalizer unit segment 403 contains the data signal groups B' and the coefficient signal groups $C_{N/3}$ through $C_{2N/3-1}$. The DATA INPUT signals are applied to equalizer unit segment 402 and the DATA OUTPUT signals are applied to output terminals of equalizer unit segment 401 and processing is resumed. The ERROR signal e is still applied to equalizer unit segment 401. In FIG. 4E, after a time period, the processing is stopped. The equalizer unit segment 401 now stores data groups C" and updated coefficient signals $C_{2N/3}$ through $C_{N-1}$, equalizer unit segment 402 stores data signal groups A" and coefficient signal groups $C_0$ through $C_{N/3-1}$, and equalizer unit segment 403 stores data signal groups B" and coefficient signal groups $C_{N/3}$ through $C_{2N/3-1}$. The data and coefficient signal groups in equalizer unit segment 401 are transferred to equalizer unit segment 402, the data and coefficient signal groups in equalizer unit segment 402 are transferred to equalizer unit segment 403, and the data and coefficient signal groups in equalizer unit segment 403 are transferred to equalizer unit segment 401. The DATA IN signal groups are applied to an input of equalizer unit segment 403, the data signal groups of segment 403 are shifted into equalizer unit segment 401, the data signal groups in equalizer unit segment 401 are shifted into equalizer unit segment 402, and the signals in equalizer unit segment 402 are the DATA OUTPUT signals.

Figure 5A:
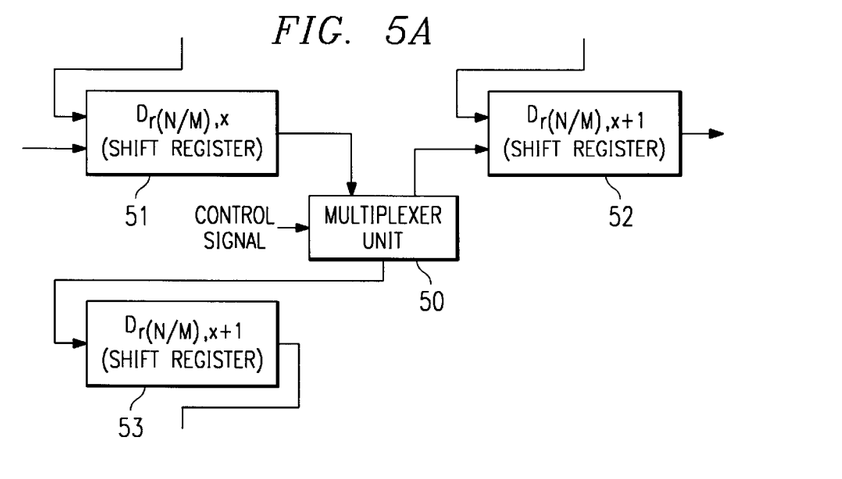
FIG. 5A and FIG. 5B are block diagrams illustrating two implementations of the transfer apparatus.
Figure 5B:
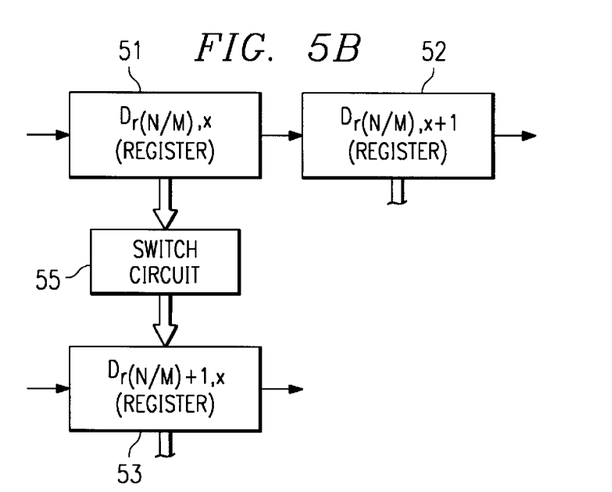

Referring to FIGS. 5A and 5B, two implementations of apparatus transferring the data signal groups from the delay line $D_{p,x}$ in the $p^{th}$ filter segment to the $D_{p,x+1}$ delay line in the $(p+1)^{th}$ filter segment and the coefficient signal group from the update unit $U_{p,x}$ in the $p^{th}$ filter segment to the update unit $U_{p+1,x}$ in the $(p+1)^{th}$ filter segment for the partitioned equalizer unit 30 having the configuration shown in FIG. 2A. The equalizer unit implementation shown in FIG. 5A is appropriate for equalizer units in which data is transferred by shift registers. Each data register 52 receives data signal from a multiplexer unit 50. The multiplexer unit 50 has the output signals from delay line 51 applied to input terminals thereof. A control signal applied to multiplexer unit 50 determines whether the data signals from delay line 51 are applied to the next sequential delay line 52 or to the delay line $D_{p,x+1}$ 53, i.e., the corresponding delay line in the next filter segment. Similarly, a multiplexer unit, in response to a control signal, determines whether a coefficient stored in update unit $(U_{p,x+1})$ is applied to multiplier unit $(M_{p,x+1})$, in a typical equalizer unit operation, or is applied to update unit $(U_{p+1,x+1})$, in a transfer of coefficient signal groups between equalizer filter segments.

The implementation of the apparatus for the transfer of data signal groups and coefficient signal groups between equalizer filter segments shown in FIG. 5B utilizes switches. For example, in response to a control signal applied to switch circuit 55, the data signal group stored in delay line 51 is transferred through switch circuit 55 to delay line 53, i.e., the transfer of a data signal group in a delay line in the $p^{th}$ equalizer unit filter segment to the corresponding delay line in the $(p+1)^{th}$ filter segment. Similarly, a switch circuit between the update unit $U_{p,x}$ and the update unit $U_{p+1,x}$ in the next sequential filter segment transfers the coefficient signal group between corresponding update units in the $p^{th}$ filter segment and the $(p+1)^{th}$ filter segment in response to a control signal applied to the switch circuit.

2. Operation of the Preferred Embodiment(s)

The operation of the present invention can be understood as follows. The coefficient signal groups $C_0$–$C_{N-1}$ are generated as the data moves through the equalizer filter. As the data groups are transmitted through the filter, the error signal causes the coefficients in the filter segment having the coefficient update units to be updated. The coefficients in the other segments are not updated. Periodically, the processing of the data signal groups is suspended. The filter segments are reconfigured and the data and coefficient signal groups are transferred among the filter segments in a cyclic manner. Then, the processing of data signal groups is resumed. As a result of the reconfiguration of the filter segments and the cyclic transfer of data and coefficient signal groups, the order in which the data signal groups are processed by the coefficients, whether or not the coefficients have been updated, is the same order as in the initial configuration of the filter.

Consequently, the equalizer filter unit processes the sequence of data signal groups using a sequence of coefficients in a manner similar to the typical equalizer filter. However, at any given period of time during which the signal groups are being processed, only a fraction, 1/M of the coefficient signal groups are being updated. The cyclic reconfiguration of the equalizer unit insures that each group of coefficient signal groups, i.e., each group of coefficient signals associated with a equalizer unit segment in the initial configuration, will be updated in the order of the initial sequence of the groups of delay lines into which the equalizer filter unit has been segmented.

The control signals activate the transfer apparatus in a manner so as not to corrupt the data being transferred through the equalizer unit. Similarly, the application of the DATA IN signals to the equalizer unit may have to be coordinated with the inter-segment signal group transfer function in order not to conflict with the processing operations. For example, the reconfiguration operation can be suspended until the after the coefficients in the initial segment have been updated. However, in order to save time, the reconfiguration can take place without the updating of the coefficients in the initial filter segment.

The present invention therefore reduces the requirement for (coefficient) updating apparatus in an equalizer filter unit. Because the updating apparatus is approximately ½ of the processing apparatus for each N components of the filter, the reduction in the apparatus is approximately from (N+N) to (N+N/M) or from 2N to N(1+1/M). This reduction in processing apparatus is achieved at the expense of a.) the apparatus for providing the transfer of the data and coefficient signal groups, b.) the apparatus for reconfiguring the segments to maintain the initial sequence of data signal group processing, and c.) the time during which the processing of the data signal is halted to provide for the transfer of the data and coefficient signal groups.

It will be further clear to those skilled that the DATA IN signal groups are applied to the equalizer filter unit relatively slowly compared to the speed of the processing apparatus of the filter unit. When this difference is sufficiently great, the transfer of data and coefficient signal groups among the segments can take place without an interruption in the entry of the DATA IN signal groups.

The apparatus implementing the inter-segment transfer of signal groups, such as the exemplary apparatus shown in FIG. 5A and FIG. 5B, will be a function of the implementation of the equalizer unit. As will be clear to those skilled in the art, the apparatus for implementing the equalizer filter is typically determined early in the design stage and the transfer apparatus and the reconfiguration apparatus are implemented to be compatible with the equalizer unit technology. While the apparatus applying signals to the multiplier unit in each component has been labeled as an update unit, it will be clear from the foregoing that only the update units in the initial filter segment include apparatus for updating the coefficients stored therein.

The implementation of the transpose adaptive filter unit, as shown in FIG. 3D, has the additional complexity that the data signals in the D' series of delay units flow in the opposite direction for the processed signals in the delay line D/adder unit A series. This different is signal flow is implemented in the configuration shown in FIG. 3D.

As will be clear to those skilled in the art, the foregoing discussion has described an equalizer filter unit which processes complex signals. The same description and discussion applies to filter units processing real signals. It will also be clear that hybrid configuration can be readily conceived using portions of the direct form equalizer with a series of adder units and the direct form equalizer unit with an adder tree. In addition, in FIG. 2A, FIG. 2B, and FIG. 2C, the D0 delay line is shown with dotted lines. These dotted lines are to indicate that this delay line is not necessary for the in-tact equalizer filter unit, however, this delay line is necessary when the equalizer filter unit is divided into segments.

While the invention has been described with particular reference to the preferred embodiment, it will be understood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. An equalizer filter unit for processing data in iterations, comprising:
    a plurality of filter unit segments, said plurality of filter units coupled in a sequential configuration, wherein each filter segment includes;
        at least one stage, said stage having,
            a data signal group storage unit, and
            a coefficient signal group storage unit,
    signal transfer apparatus, said signal transfer apparatus transferring data and coefficient signal groups in each filter segment after at least one iteration from each such filter segment to a next sequential filter segment for use in said next sequential filter segment in at least one subsequent iteration; and
    a configuration unit for maintaining said sequential configuration of said filter units segments after transfer of said data and coefficient signal groups;
    wherein each stage in a preselected filter segment further has a coefficient signal group update unit.

2. The equalizer filter unit of claim 1 wherein said configuration unit includes:
    an input demultiplexer coupled to an input terminal of each filter unit segment; and
    an output multiplexer component coupled to an output terminal of each filter unit segment.

3. The equalizer filter unit of claim 2 wherein each output multiplexer selects between applying processed signals of a filter segment to an output terminal of the equalizer filter unit or to an input terminal of a next sequential segment; and wherein each input demultiplexer selects between data signal groups being applied to said equalizer filter unit and a delayed output signal up from a next prior sequential filter segment.

4. The equalizer unit of claim 1 wherein each stage of said filter segments further includes a delay line, each delay line storing a data signal group, wherein data signal groups flow through said delay lines in a reverse sequential order, said configuration unit maintaining said reverse sequential order for said delay lines after transfer of said data and said coefficient signal groups.

5. The equalizer unit of claim 1 wherein each stage further having:
    a multiplier unit; and
    an adder unit, wherein said data signal storage unit is a delay line.

6. A method for processing data in an equalizer filter unit in iterations, said method comprising the steps of:
    dividing said filter unit into a plurality of sequential segments;
    updating coefficients in a preselected segment of said filter;
    providing data to said equalizer filter;
    performing at least one iteration;
    transferring data and coefficient signal groups from components in each segment to similarly positioned components in a next sequential segment;
    reconfiguring said equalizer filter; and
    performing at least one additional iteration;

wherein said an order of said sequential segments is maintained.

7. The method of claim 6 wherein said reconfiguring step includes the step of maintaining selected components in said segments in a reverse sequential order.

8. An equalizer filter unit responsive to an error signal for processing input data signal groups in iterations, said filter unit comprising:

a first plurality of processing components each having a sequential coefficient signal group stored therein for processing a data signal group stored therein, said first plurality of components divided into a second plurality of sequential groups of components;

updating apparatus responsive to said error signal for updating coefficient signal groups in a selected group of components;

signal transfer apparatus for transferring data and coefficient signal groups from components in each group of components after at least one iteration to corresponding components in a next sequential group of components for use in said next sequential group of components in at least one subsequent iteration; and     configuration apparatus for maintaining said components in an initial sequence.

9. The filter unit of claim 8 wherein each component further includes a delay line, said delay lines coupled to transmit data signal groups in reverse sequential order compared to said sequential group of components, wherein said configuration apparatus maintains said delay lines in said reverse sequential order.

10. The equalizer filter unit of claim 8 wherein the number of said first plurality of processing components is equal to the number of said second plurality of sequential groups of components.

11. An equalizer filter unit for processing input signal groups in iterations, comprising:

a first plurality of components in a sequential order for processing input signal groups in said sequential order for at least one interation, each component having coefficient units storing coefficient signal groups used in processing said input signal groups, said first plurality of components being configured in a second plurality of component groups, wherein components in a selected component group include coefficient update apparatus responsive to an error signal for updating said coefficient stored in each component of said selected component group;

transfer apparatus for transferring data and coefficient signal groups from components in each component group after said at least one interation to corresponding components in a next sequential component group; and     reconfiguration apparatus for configuring said second plurality of component groups, wherein input signals are processed in at least one subsequent iteration in said sequential order after said transfer of data and coefficient signal groups.

12. The unit of claim 11 wherein each component includes a delay, said delay lines being coupled in a reverse sequential order, wherein said reconfiguration apparatus includes apparatus for maintaining a flow of signal groups in said reverse sequential order through said delay lines.

\* \* \* \* \*

UNITED STATES PATENT AND TRADEMARK OFFICE
CERTIFICATE OF CORRECTION

PATENT NO.    : 6,480,534 B1
DATED         : November 12, 2002
INVENTOR(S)   : Alan Gatherer and Hiep Van Tran It is certified that error appears in the above-identified patent and that said Letters Patent is hereby corrected as shown below:

<u>Title page,</u>
Please insert the following:

-- Related U.S. Application Data

[60] Provisional application No. 60/062,656 October 8, 1997. --

Signed and Sealed this

Eighth Day of July, 2003

JAMES E. ROGAN
*Director of the United States Patent and Trademark Office*